United States Patent
Tseng et al.

(10) Patent No.: US 8,635,581 B1
(45) Date of Patent: Jan. 21, 2014

(54) METHOD AND APPARATUS FOR SINGLE EVENT UPSET (SEU) DETECTION AND CORRECTION

(71) Applicant: Xilinx, Inc., San Jose, CA (US)

(72) Inventors: Chen W. Tseng, Longmont, CO (US); Weiguang Lu, San Jose, CA (US); Karthy Rajasekharan, Santa Clara, CA (US); Matthew H. Klein, Redwood City, CA (US); Restu I. Ismail, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/842,502

(22) Filed: Mar. 15, 2013

(51) Int. Cl.
*G06F 11/22* (2006.01)
*G06F 17/50* (2006.01)

(52) U.S. Cl.
USPC ............................................ 716/136; 716/117

(58) Field of Classification Search
USPC ................................................. 716/117, 136
See application file for complete search history.

(56) References Cited

U.S. PATENT DOCUMENTS

| | | | |
|---|---|---|---|
| 7,143,329 B1 * | 11/2006 | Trimberger et al. | 714/746 |
| 7,249,010 B1 | 7/2007 | Sundararajan et al. | |
| 7,406,673 B1 | 7/2008 | Patterson et al. | |
| 7,620,883 B1 * | 11/2009 | Carmichael et al. | 714/797 |
| 8,146,028 B1 * | 3/2012 | Lesea | 716/104 |
| 2012/0131417 A1 | 5/2012 | Rodriguez et al. | |

OTHER PUBLICATIONS

U.S. Appl. No. 13/842,140, filed Mar. 15, 2013, Tseng et al.
Xilinx, *LogiCORE IP Soft Error Mitigation Controller v3.4*, PG036, Dec. 18, 2012, pp. 1-166, Xilinx, Inc., San Jose, California, USA.

* cited by examiner

*Primary Examiner* — Suresh Memula
(74) *Attorney, Agent, or Firm* — Kin-Wah Tong (57) ABSTRACT

A method, non-transitory computer readable medium, and apparatus for performing single event upset detection and correction are disclosed. For example, the method comprises: setting, by a processor, at least one starting address for each of a plurality of rows of a design for an integrated circuit, setting, by the processor, at least one ending address for each of the plurality of rows of the design, and performing, by the processor, the single event upset detection and correction scan in parallel, from the at least one starting address for each of the plurality of rows to the at least one ending address for each of the plurality of rows.

20 Claims, 6 Drawing Sheets

METHOD AND APPARATUS FOR SINGLE EVENT UPSET (SEU) DETECTION AND CORRECTION

TECHNICAL FIELD

The present disclosure relates generally to the testing of integrated circuits (ICs), and more particularly to a method and apparatus for single event upset detection and correction.

BACKGROUND

Currently, error detection in integrated circuits, e.g., programmable ICs such as field programmable gate arrays (FPGAs), require scanning to be performed from beginning to end (e.g., beginning at frame zero at the left and scanning to the right until the row ends) and then from one row to the next row in a sequential order. This method of error detection assumes that all logic within an IC is of equal importance.

As the amount of logic and the sizes of ICs grow, the time for scanning may rise into milliseconds or seconds. As a result, error detection and scanning using current methods can be very time consuming given the ever growing size of ICs.

SUMMARY OF THE INVENTION

The present disclosure provides a method for performing single event upset detection and correction. For example, the method can comprise: setting, by a processor, at least one starting address for each of a plurality of rows of a design for an integrated circuit, setting, by the processor, at least one ending address for each of the plurality of rows of the design, and performing, by the processor, the single event upset detection and correction scan in parallel, from the at least one starting address for each of the plurality of rows to the at least one ending address for each of the plurality of rows.

In various embodiments: the at least one starting address for each of the plurality of rows and the at least one ending address for each of the plurality of rows, can correspond to one or more modules of the design that are located in the integrated circuit; the method further comprises calculating, by the processor, a scan time for each of the one or more modules based upon a number of addresses that are scanned between a respective starting address and a respective ending address, and prioritizing, by the processor, the single event upset detection and correction scan for the one or more modules based on an importance level of each of the one or more modules, the scan time that is calculated for each of the one or more modules, and a total amount of time available for the single event upset detection and correction scan; the at least one starting address for each of the plurality of rows is different and the at least one ending address for each of the plurality of rows is different; the at least one starting address for two or more of the plurality of rows is identical; the at least one ending address for two or more of the plurality of rows is identical; each of the at least one starting address and the at least one ending address comprises a physical address; each of the at least one starting address and the at least one ending address comprises a physical address derived from a provided number of slices contained within a module of the design; and one or more of the plurality of rows include two or more different starting addresses and two or more different ending addresses.

The present disclosure also provides a non-transitory computer-readable medium storing a plurality of instructions which, when executed by a processor, cause the processor to perform operations for performing single event upset detection and correction. For example, the non-transitory computer-readable medium can comprise a plurality of instructions for: setting at least one starting address for each of a plurality of rows of a design for an integrated circuit, setting at least one ending address for each of the plurality of rows of the design, and performing the single event upset detection and correction scan in parallel, from the at least one starting address for each of the plurality of rows to the at least one ending address for each of the plurality of rows.

The present disclosure also provides an apparatus for performing single event upset detection and correction. For example, the apparatus can comprise: a processor, and a computer-readable medium storing a plurality of instructions which, when executed by the processor, cause the processor to perform operations. The operations can include: setting at least one starting address for each of a plurality of rows of a design for an integrated circuit, setting at least one ending address for each of the plurality of rows of the design, and performing the single event upset detection and correction scan in parallel, from the at least one starting address for each of the plurality of rows to the at least one ending address for each of the plurality of rows.

BRIEF DESCRIPTION OF THE DRAWINGS

Accompanying drawings show exemplary circuits and methods in accordance with one or more aspects of the invention. However, the accompanying drawings should not be taken to limit the invention to the examples shown, but are for explanation and understanding only.

To facilitate understanding, identical reference numerals have been used, where possible, to designate identical elements that are common to the figures.

DETAILED DESCRIPTION

The present disclosure broadly discloses a method, non-transitory computer readable medium and apparatus for performing single event upset (SEU) detection and correction. As discussed above, current error detection methods of integrated circuits, e.g., a programmable integrated circuits, require scanning to be performed from beginning to end (e.g., beginning at frame zero at the left and scanning to the right until the row ends) and then from one row to the next row. This method of error detection assumes that all logic within the integrated circuit is of equal importance. As a result, error detection and scanning using current methods can be very time consuming given the large ever growing size of integrated circuits.

An illustrative method for performing SEU scanning on an integrated circuit, e.g., a programmable integrated circuit, at any starting point to any ending point based upon a physical address is disclosed. "Scanning" or "to scan" can be defined as including both a detection and a correction process. For example, each module of a design is at a known location of the programmable integrated circuit. As a result, the beginning and the end of the module corresponds to known physical addresses. These addresses are used to instruct a soft error mitigation (SEM) intellectual property (IP) or an external controller to perform the scan on one or more specific modules. In other words, the scan does not have to be performed over the entire programmable integrated circuit in a consecutive sequential order.

Figure 5:
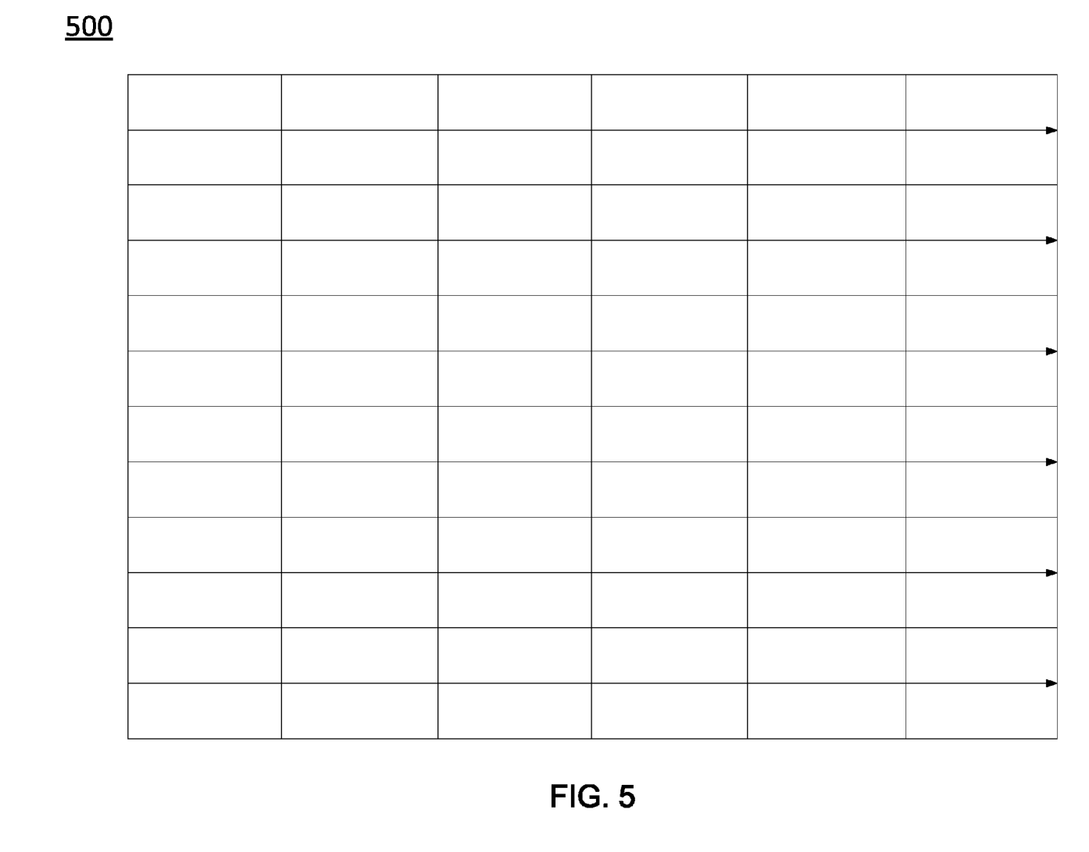
FIG. 5 illustrates a block diagram of a programmable integrated circuit demonstrating parallel detection/correction starting at address 0 and proceeding through the entire device.

In addition, the present disclosure allows the scan to be performed on a plurality of rows of the programmable integrated circuit in parallel. FIG. 5 illustrates on example of a programmable integrated circuit 500 performing a parallel scan that begins at starting address 0 for each line and proceeds through the entire device. For example, the arrows all begin from the far left edge and proceed all the way to the far right edge to completion.

Figure 6:
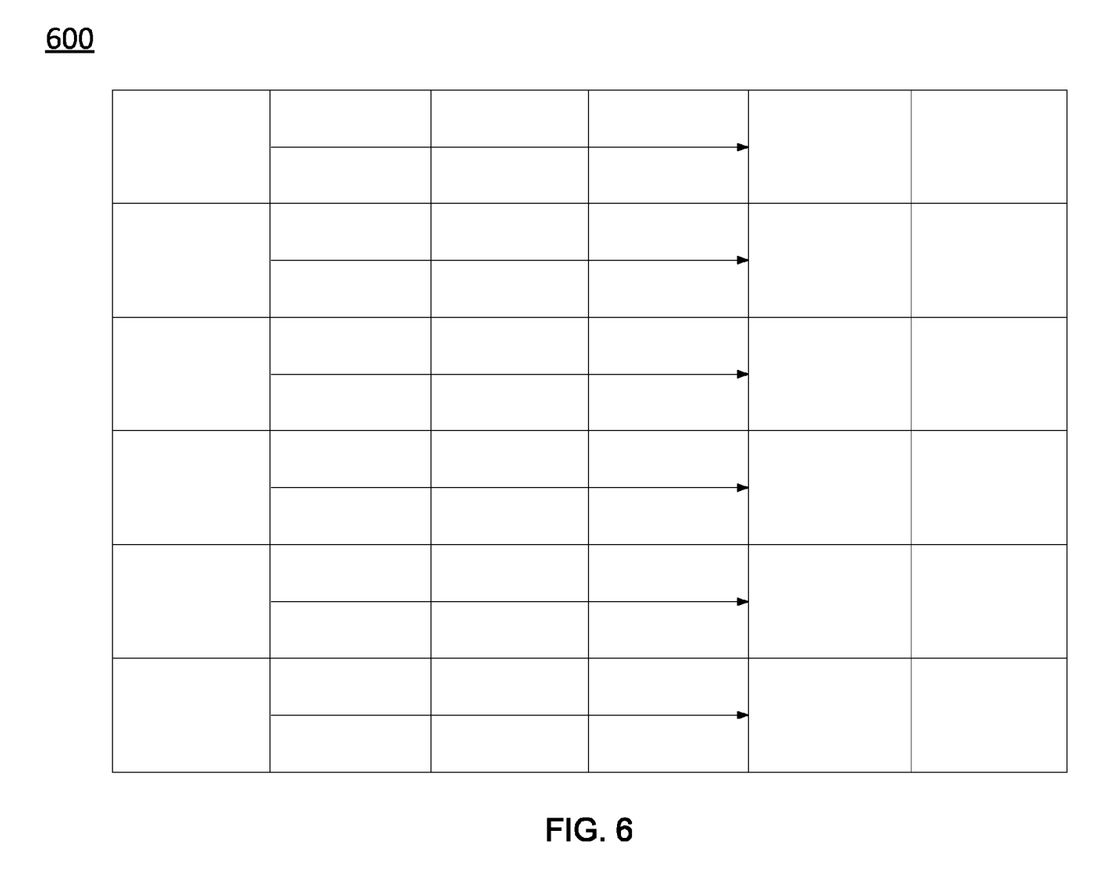
FIG. 6 illustrates a block diagram of a programmable integrated circuit demonstrating that all parallel detection/correction starting at a specified address.

The present disclosure allows the scan to start at the same address and to end at the same address. FIG. 6 illustrates an example of a programmable integrated circuit 600 performing a parallel scan that begins at a same specified starting address and ends at a specified or default ending address. For example, the arrows all begin from a common address somewhere after address 0 and end at some common address somewhere before the last address.

Figure 7:
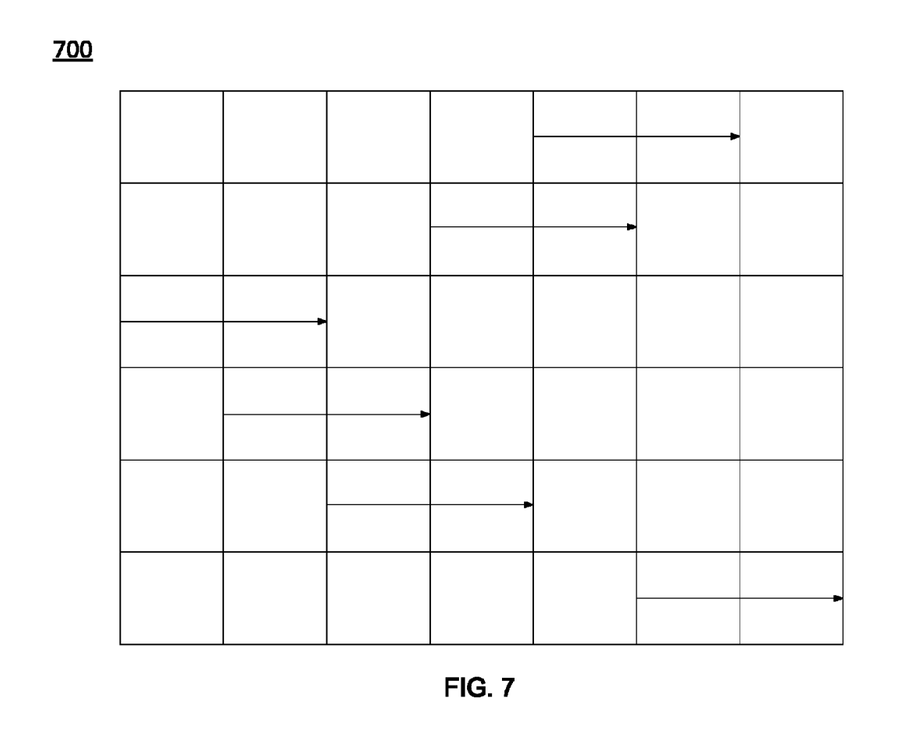
FIG. 7 illustrates a block diagram of a programmable integrated circuit demonstrating detection/correction starting and ending at a specified address.

The scan of each row may start at different addresses and end at different addresses. FIG. 7 illustrates an example programmable integrated circuit 700 performing a parallel scan where each row can start and stop the scan at any specified starting address and ending address. For example, none of the arrows in FIG. 7 are aligned. In other words, each row is operated in parallel independent from one another. In addition, the scan starts and stops at multiple different addresses in the same row.

A user can deem certain modules within the design as critical or relatively important. For example, some modules perform mission critical functions. Thus, using the known physical addresses that each module spans, a user can prioritize the scan of each module based upon an importance of the modules. As a result, a smarter and more efficient SEU detection and correction scan can be performed compared to presently available methods.

Figure 1:
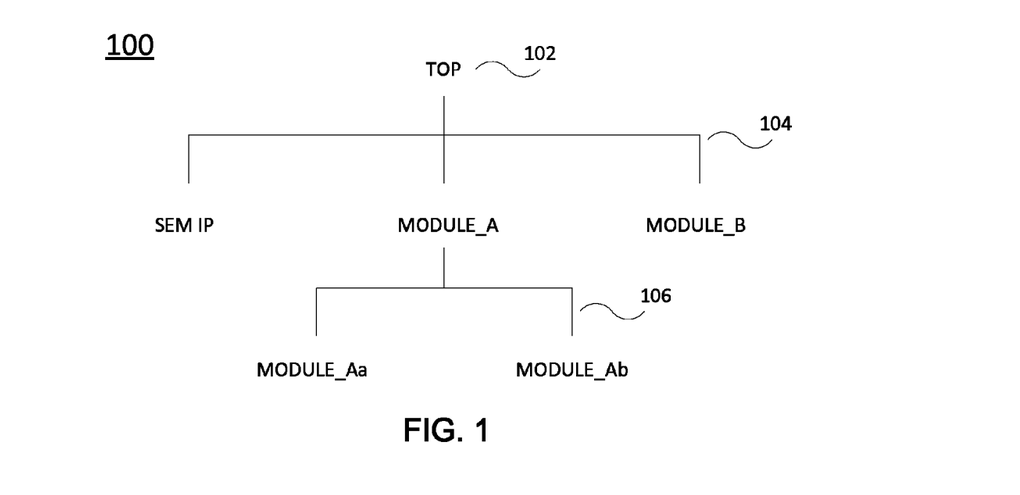
FIG. 1 illustrates one example block diagram of a hierarchical design.
Figure 4:
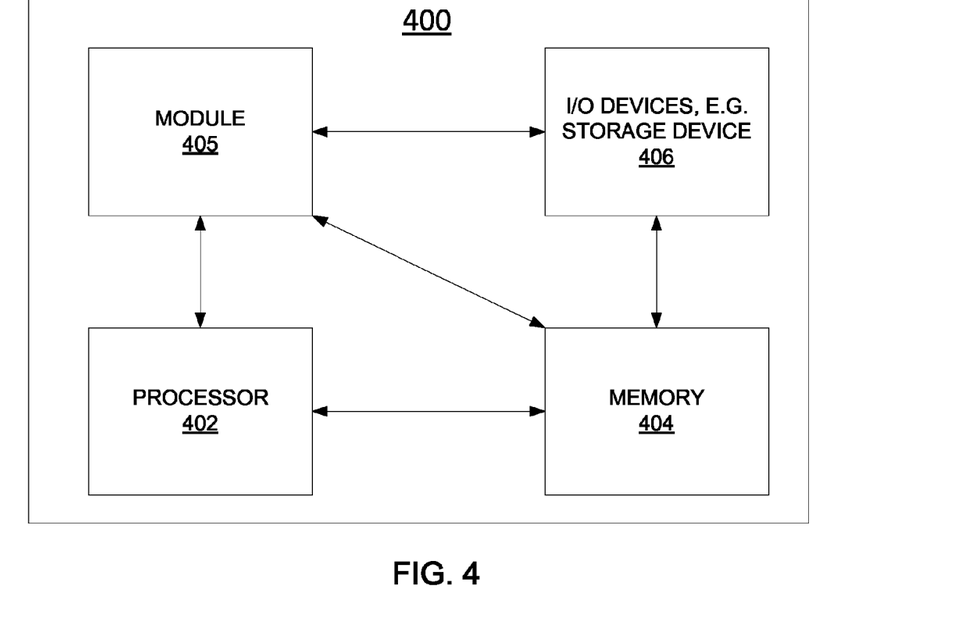
FIG. 4 illustrates a high-level block diagram of a general-purpose computer suitable for use in performing the functions described herein.

FIG. 1 illustrates a high level block diagram of a hierarchical design 100. The hierarchical design can be created in a program executed on a general purpose computer, e.g., as illustrated in FIG. 4 and discussed below. One example program may be the Vivado® software from Xilinx Corporation®.

Hierarchical design 100 includes a top level 102, a second level 104, and a third level 106. Although three levels are illustrated in FIG. 1, it should be noted that any number of levels may be deployed in the hierarchical design 100. In the pictured example, the second level 104 includes a SEM IP module, a module_A and a module_B, and the third level 106 includes one or more sub-modules of module_A, i.e., module_Aa and module_Ab.

Each one of the modules that is created in the hierarchical design 100 may be created and implemented such that each module is carved out of the hierarchical design 100 and decoupled from the hierarchical design 100. In other words, the modules may be created such that each module is restricted to a known area within the device and ensures that no cross pollination of the module logic will occur.

Creating each module such that each module is restricted to a known area within the device allows a physical address to be derived. This will allow a user to have confidence in that the SEU detection and correction scan is performed on the specific modules that were selected, as will be discussed below.

Figure 2:
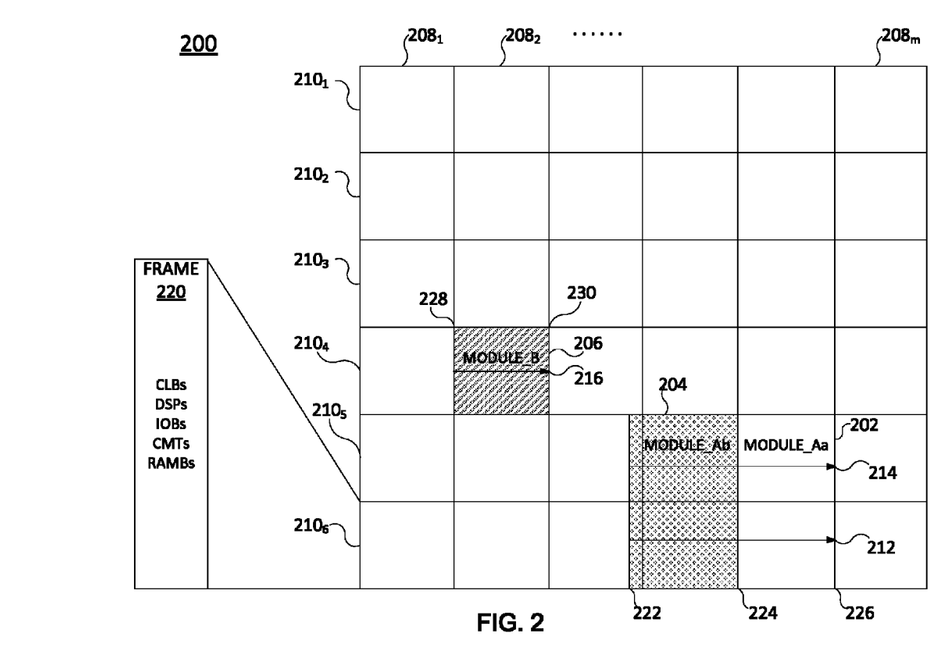
FIG. 2 illustrates one example of a block diagram of a programmable integrated circuit.

FIG. 2 illustrates a block diagram of one example of an IC, e.g., a programmable integrated circuit 200. Programmable integrated circuit 200 includes a plurality of columns $208_1$ to $208_m$ (also referred to collectively as columns 208) and a plurality of rows $210_1$ to $210_6$ (also referred to collectively as rows 210). It should be noted that although six rows are illustrated by the example in FIG. 2, the programmable integrated circuit 200 may include any number of rows.

A combination of one of the columns 208 and one of the rows 210 may create a frame 220 of a clock region 208×210. Each frame includes various parts such as control logic blocks (CLBs), digital signal processors (DSPs), input/output blocks (IOBs), clock management tiles (CMTs), block random access memory (RAMBs), and the like.

For example, a height of each row 210 may include slices of CLBs, RAMBs, DSPs, and so forth. Said another way, each frame spans the height of a clock region. Each column 208 can be composed of a plurality of frames 220.

FIG. 2 illustrates a location of each one of the modules from the hierarchical design 100 illustrated in FIG. 1. For example, the programmable integrated circuit 200 includes the module_Ab 202 and the module_Ab 204 (which together form the entire module_A) and the module_B 206. The modules 202, 204 and 206 can span at least the height of a row 210. However, the modules can span one or more columns 208 and/or one or more rows 210 (e.g., module_Aa 202 and module_Ab 204 span over two rows and three columns).

As noted above, the modules 202, 204 and 206 are in known locations within the programmable integrated circuit 200. The modules 202, 204 and 206 are constrained via area group (AG) constraints. The AG has the property of being able to contain only related module logic and ensure module routing, other than interface routing, must stay within the AG. This prevents cross pollination as noted above and allows the module to be a fully independent module carved out of the hierarchical design 100. In addition, by being in known locations, a physical address of each bit that is tested within each of the modules 202, 204 or 206 can be derived from a frame address of the respective modules 202, 204 or 206.

As noted above, previous scanning methods required scanning one row at a time in a sequential order. For example, previous methods would begin at frame 0 and scan from left to right beginning with row $210_4$ and proceed from left to right in row $210_5$, $210_6$, $210_3$, $210_2$ and $210_1$ in that order.

The amount of time required to perform the scan can be decreased by allowing each row 210 to be scanned in parallel, as described in the present disclosure. For example, a single controller can control a respective engine responsible for performing the scan within each row $210_1$ to $210_6$. In other words, if there are six rows, then six engines are deployed under the control of a single controller.

In addition, due to the fact that the hierarchical design 100 is created and implemented in the programmable integrated circuit such that each module of the hierarchical design 100 is in a known location, a more efficient method for scanning the programmable integrated circuit is provided. For example, the module_Aa 202 begins at a frame address 224 and ends at a frame address 226 in rows $210_5$ and $210_6$. The module_Ab 204 begins at a frame address 222 and ends at the frame address 224 in rows $210_5$ and $210_6$. The module_B 206 begins at a frame address 228 and ends at a frame address 230.

These frame addresses 222-230 can be translated into physical addresses that can be provided to the engine for performing the scan. The engine may be a SEM IP or an external controller, for example. As a result, the SEU detection and correction scan can occur in parallel in each row using a selected starting address and ending address for each row. It should be noted that the starting address for each row may be a non-zero address. In other words, the starting address is not required to be the first frame on the left side of a row. In addition, it should be noted that the ending address for each row may not be a last frame. In other words, the ending address for each row can be some address before the end of the row.

The ending address can be a specified address. Alternatively, the ending address may not be specified (e.g., if no ending address is specified, the scan may loop back to the starting address). In other words, setting an ending address may include either using a specified ending address or "setting" the ending address as unspecified such that the scan may automatically loop back to the starting address. The ending address can be before the starting address. With this setup, the scan will automatically loop back to the start of the device and end at the ending address.

To illustrate, for the scan of row $210_4$, the starting address can be set as the physical address associated with the frame address 228 and the ending address can be set as the physical address associated with the frame address 230. The starting address and ending address can be set similarly for the rows $210_5$ and $210_6$. Once all of the starting addresses and ending addresses are set for each row 210, the scan is performed as indicated by arrows 212, 214 and 216.

In other words, the present disclosure does not require the scan to occur from frame 0 at the left to the end of the row. Rather, since the location of each of the modules is known, the scan occurs in each row in parallel, from a respective starting address to a respective ending address.

The starting address can be the same for each one of the rows 210. Alternatively, the starting address can be different for each one of the rows 210. The starting address can also be the same for two or more rows. For example, some modules (e.g., module_Aa 202 and module_Ab 204) span multiple rows 210 and have the same starting address for multiple rows.

The ending address can be the same for each one of the rows 210. Alternatively, the ending address can be different for each one of the rows 210. The ending address can also be the same for two or more rows. For example, some modules (e.g., module_Aa 202 and module_Ab 204) span multiple rows 210 and have the same ending address for multiple rows.

One or more rows 210 can have two or more starting addresses and ending addresses. For example, if a row 210 contains two or more modules that are spaced apart within a row, the scan is performed on each one of the modules without needing to scan the empty addresses between the modules. Thus, a scan on one row 210 starts at a first starting address, proceeds to a first ending address and then restarts at a second starting address and proceeds to a second ending address and so forth until all of the desired modules within a single row are scanned.

As noted above, the physical address can be derived from a frame address. The hierarchical design can be displayed in a graphical user interface (GUI) that provides location information in the form of slices, for example. In the GUI environment, a user provides a number of slices contained in the desired modules to be scanned as the starting address and ending address. From the number of slices, the frame address range of the desired modules is derived, which can then be used to derive the physical address.

Since the locations, and correspondingly the address range, of each module are known within the programmable integrated circuit 200, a scan time for each one of the modules can be calculated. For example, based upon the scan time per address and the number of addresses that span the module, the scan time is calculated. Using the scan time information for each one of the modules, a user can then prioritize which modules should be scanned based upon a total amount of time available for the SEU detection and correction scan. For example, the user can prioritize the SEU detection and correction scan of the modules based upon an importance level of each one of the modules, the scan time that is calculated for each one of the modules, and the total amount of time available for the SEU detection and correction scan.

Another benefit of being able to specify the starting address and the ending address for each row of the scan is that if the scan is interrupted, the user can note where the scan was paused, and can resume the scan from the address where the scan was interrupted. In contrast, in previous methods, if the scan was interrupted or a correction was made, the scan would be required to restart from the very beginning at frame zero.

Figure 3:
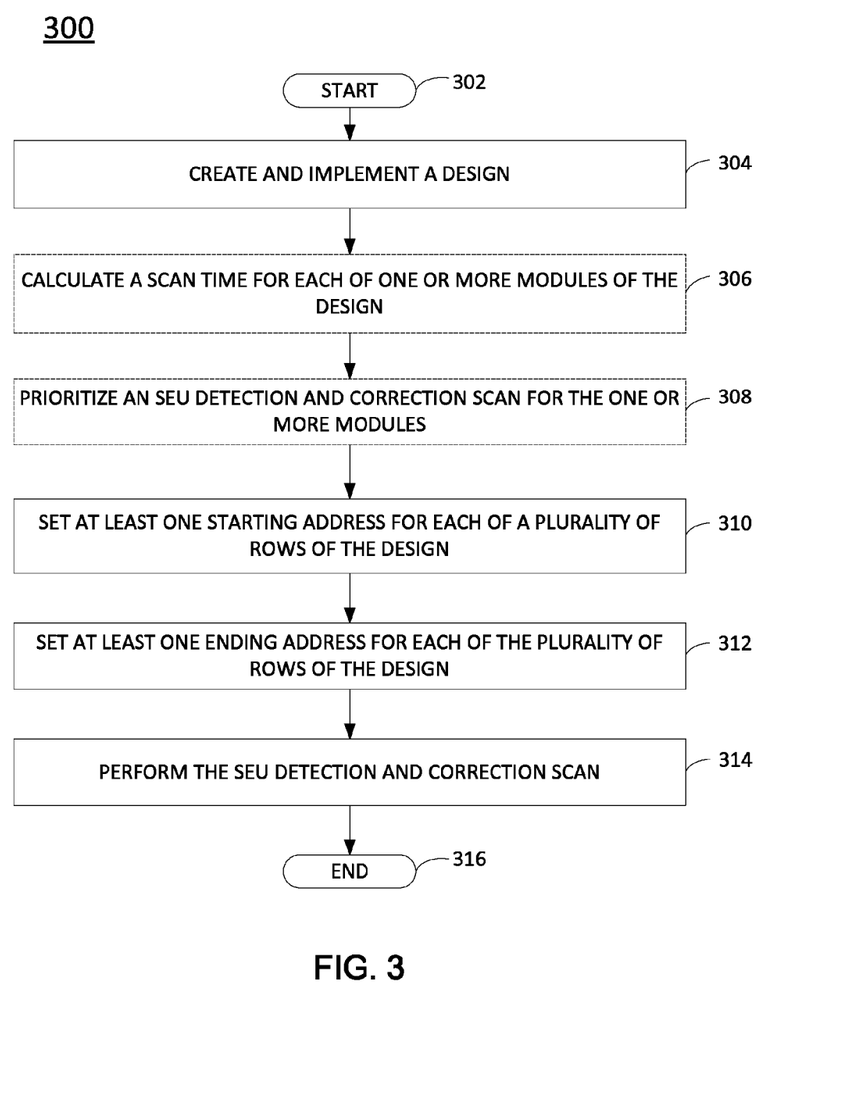
FIG. 3 illustrates an example flowchart of a method for performing single event upset (SEU) detection and correction.

FIG. 3 illustrates a flowchart of a method 300 for performing single event upset (SEU) detection and correction. The method 300 may be performed by a general purpose computer as illustrated in FIG. 4 and discussed below, for example.

The method 300 begins at step 302. At step 304, the method 300 creates and implements a hierarchical design. For example, a program such as the Vivado® software produced by Xilinx Corporation® running on a general purpose computer can be used to create and implement the hierarchical design.

As discussed above, each of the modules that is created in the hierarchical design 100 can be created and implemented, such that each module is carved out of the hierarchical design 100 and decoupled from the hierarchical design 100. In other words, the modules may be created such that each module is restricted to a known area within the device and ensures that no cross pollination of the module logic occurs.

The modules can be constrained via AG constraints, for example. The AG has the property of being able to contain only related module logic and ensure module routing, other than interface routing, must stay within the AG. This prevents cross pollination, as noted above, and allows the module to be a fully independent module to be carved out of the hierarchical design. In addition, by being in known locations, a physical address of each bit that is tested within a module may be derived from a frame address of the module.

Implementing the modules may be defined as fully compiling the modules of the hierarchical design to be ready for use or deployment. For example, all the run files of the modules may be executed within the design program to ensure each module is error free.

At optional step 306, the method 300 calculates a scan time for each of the one or more modules of the design. For example, since the location of each of the modules is known and fixed within the programmable integrated circuit, a corresponding number of addresses that the modules span is known. Thus, based upon a scan time per address, the scan time for each of the modules can be calculated.

At optional step 308, the method 300 prioritizes an SEU detection and correction scan for the one or more modules. A limited amount of time may be available for performing the SEU detection and correction scan. As a result, a user can prioritize the modules for scanning based upon an importance level of each of the modules, the scan time that is calculated for each of the modules from optional step 306, and the total amount of time available for the SEU detection and correction scan.

Notably, previous methods did not allow a user to prioritize or select which modules to be scanned. Rather, the previous methods required the scan to be completed from the first frame at frame 0 to the last frame, row by row in a serial fashion. In contrast, the present disclosure provides a more efficient method of performing a scan, because the user can select and prioritize which modules are to be scanned without requiring a complete scan of the entire integrated circuit.

At step 310, the method 300 sets at least one starting address for each of a plurality of rows of the design. The starting address can be the physical address associated with the first frame address of a module, e.g., where the module starts in a row, for example. In a GUI environment, a user may provide a number of slices contained in the desired modules to be scanned as the starting address and ending address. From the number of slices, the frame address range of the desired modules can be derived, which is then used to derive the physical address for the starting address.

The starting address can be the same for each one of the rows. Alternatively, the starting address can be different for each one of the rows. The starting address can also be the same for two or more rows. For example, some modules span multiple rows and have the same starting address for multiple rows.

One or more rows may have two or more starting addresses. For example, if a row contains two or more modules that are spaced apart within a row, the scan can be performed on each one of the modules without needing to scan the empty addresses between the modules. Thus, a scan on one row may start at a first starting address until the scan of the first module is completed and then restart at a second starting address until the scan of the second module is completed and so forth until all of the desired modules within a single row are scanned.

At step 312, the method 300 sets at least one ending address for each of the plurality of rows of the design. The ending address may be the physical address associated with the last frame address of a module, e.g., where the module ends in a row. In a GUI environment, a user can provide a number of slices contained in the desired modules to be scanned as the starting address and ending address, for example. From the number of slices, the frame address range of the desired modules can be derived, which is then used to derive the physical address for the ending address.

The ending address may be a specified address. Alternatively, the ending address may not be specified (e.g., if no ending address is specified, the scan may loop back to the starting address). In other words, setting an ending address may include either using a specified ending address or "setting" the ending address as unspecified such that the scan can automatically loop back to the starting address.

The ending address may be the same for each one of the rows. Alternatively, the ending address can be different for each one of the rows. The ending address can also be the same for two or more rows. For example, some modules span multiple rows and have the same ending address for multiple rows.

One or more rows can have two or more ending addresses. For example, if a row contains two or more modules that are spaced apart within a row, the scan is performed on each one of the modules without needing to scan the empty addresses between the modules. Thus, a scan on one row may start at the first starting address and proceed to a first ending address and then restart at the second starting address and proceed to a second ending address and so forth, until all of the desired modules within a single row are scanned.

At step 314, the method 300 performs the SEU detection and correction scan. For example, the scan is performed in parallel, from the starting address for each of the plurality of rows to the ending address for each of the plurality of rows. In other words, each row is scanned at the same time according to its respective starting address or addresses and respective ending address or addresses. The method 300 ends at step 316.

It should be noted that although not explicitly specified, one or more steps of the method 300 described above may include a storing, displaying and/or outputting step as required for a particular application. In other words, any data, records, fields, and/or intermediate results discussed in the methods can be stored, displayed, and/or outputted to another device as required for a particular application. Furthermore, steps, operations or blocks in FIG. 3 that recite a determining operation, or involve a decision, do not necessarily require that both branches of the determining operation be practiced. In other words, one of the branches of the determining operation can be deemed as an optional step.

FIG. 4 depicts a high level block diagram of a general purpose computer, a computing device, or a computing system 400 suitable for use in performing some or all of the functions described herein. As depicted in FIG. 4, the system 400 comprises a hardware processor element 402 (e.g., a CPU), a memory 404, e.g., random access memory (RAM) and/or read only memory (ROM), a module 405 for performing SEU detection and correction, and various input/output devices 406, e.g., storage devices, including but not limited to, a tape drive, a floppy drive, a hard disk drive or a compact disk drive, a receiver, a transmitter, a speaker, a display, a speech synthesizer, an output port, and/or a user input device (such as a keyboard, a keypad, a mouse, and the like). The hardware processor element may have other forms, such as for example, a finite state machine and associated logic or be embedded configuration logic.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or operations of the above disclosed method. In other words, these methods can be implemented in a combination of software and hardware, e.g., using application specific integrated circuits (ASIC), a programmable IC, a general purpose computer or any other hardware equivalents such as microprocessors. The present module or process 405 for performing SEU detection and correction for an IC such as a programmable integrated circuit can be loaded into memory 404 and executed by hardware processor 402 to implement the functions as discussed above. As such, the present method 405 for performing SEU detection and correction for an IC such as a programmable integrated circuit as discussed above in method 300 (including associated data structures) of the present disclosure can be stored on a non-transitory (e.g., tangible or physical) computer readable storage medium, e.g., RAM memory, magnetic or optical drive or diskette and the like.

The exemplary methods and apparatus may also be implemented in whole or in part by a programmable IC, e.g., a programmable logic device (PLD). More specifically, a programmable integrated circuit is a general-purpose device that can be programmed by a user to implement a variety of selected functions. A programmable integrated circuit typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the programmable integrated circuit and/or to receive input signals from the external programmable integrated circuit pins. The programmable integrated circuit also includes a programmable interconnect structure that can be programmed to selectively route signals among the various CLBs and IOBs to produce more complex functions of many input signals. The CLBs, IOBs, and the programmable interconnect structure are programmed by loading configuration data (e.g., from general purpose computer 400) into associated memory cells that control various switches and multiplexers within the CLBs, IOBs, and the interconnect structure to implement logic and routing functions specified by the configuration data to implement a user design in the programmable integrated circuit. A programmable integrated circuit may also include other programmable and non-programmable resources.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for performing single event upset detection and correction, comprising:
   setting, by a processor, at least one starting address for each of a plurality of rows of a design for an integrated circuit;
   setting, by the processor, at least one ending address for each of the plurality of rows of the design; and
   performing, by the processor, the single event upset detection and correction scan in parallel, from the at least one starting address for each of the plurality of rows to the at least one ending address for each of the plurality of rows.

2. The method of claim 1, wherein the at least one starting address for each of the plurality of rows and the at least one ending address for each of the plurality of rows, correspond to one or more modules of the design that are located in the integrated circuit.

3. The method of claim 2, further comprising:
   calculating, by the processor, a scan time for each of the one or more modules based upon a number of addresses that are scanned between a respective starting address and a respective ending address; and
   prioritizing, by the processor, the single event upset detection and correction scan for the one or more modules based on an importance level of each of the one or more modules, the scan time that is calculated for each of the one or more modules, and a total amount of time available for the single event upset detection and correction scan.

4. The method of claim 1, wherein the at least one starting address for each of the plurality of rows is different and the at least one ending address for each of the plurality of rows is different.

5. The method of claim 1, wherein the at least one starting address for two or more of the plurality of rows is identical.

6. The method of claim 1, wherein the at least one ending address for two or more of the plurality of rows is identical.

7. The method of claim 1, wherein each of the at least one starting address and the at least one ending address comprises a physical address.

8. The method of claim 1, wherein each of the at least one starting address and the at least one ending address comprises a physical address derived from a provided number of slices contained within a module of the design.

9. The method of claim 1, wherein one or more of the plurality of rows include two or more different starting addresses and two or more different ending addresses.

10. A non-transitory computer-readable medium storing a plurality of instructions which, when executed by a processor, cause the processor to perform operations for performing single event upset detection and correction, the operations comprising:
    setting at least one starting address for each of a plurality of rows of a design for an integrated circuit;
    setting at least one ending address for each of the plurality of rows of the design; and
    performing the single event upset detection and correction scan in parallel, from the at least one starting address for each of the plurality of rows to the at least one ending address for each of the plurality of rows.

11. The non-transitory computer-readable medium of claim 10, wherein the at least one starting address for each of the plurality of rows and the at least one ending address for each of the plurality of rows, correspond to one or more modules of the design that are located in the integrated circuit.

12. The non-transitory computer-readable medium of claim 11, further comprising:
    calculating a scan time for each of the one or more modules based upon a number of addresses that are scanned between a respective starting address and a respective ending address; and
    prioritizing the single event upset detection and correction scan for the one or more modules based on an importance level of each of the one or more modules, the scan time that is calculated for each of the one or more modules, and a total amount of time available for the single event upset detection and correction scan.

13. The non-transitory computer-readable medium of claim 10, wherein the at least one starting address for each of the plurality of rows is different and the at least one ending address for each of the plurality of rows is different.

14. The non-transitory computer-readable medium of claim 10, wherein the at least one starting address for two or more of the plurality of rows is identical.

15. The non-transitory computer-readable medium of claim 10, wherein the at least one ending address for two or more of the plurality of rows is identical.

16. The non-transitory computer-readable medium of claim 10, wherein each of the at least one starting address and the at least one ending address comprises a physical address.

17. The non-transitory computer-readable medium of claim 10, wherein each of the at least one starting address and the at least one ending address comprises a physical address derived from a provided number of slices contained within a module of the design.

18. The non-transitory computer-readable medium of claim 10, wherein one or more of the plurality of rows include two or more different starting addresses and two or more different ending addresses.

19. An apparatus for performing single event upset detection and correction, comprising:
- a processor; and
- a computer-readable medium storing a plurality of instructions which, when executed by the processor, cause the processor to perform operations, the operations comprising:
  - setting at least one starting address for each of a plurality of rows of a design for an integrated circuit;
  - setting at least one ending address for each of the plurality of rows of the design; and
  - performing the single event upset detection and correction scan in parallel, from the at least one starting address for each of the plurality of rows to the at least one ending address for each of the plurality of rows.

20. The apparatus of claim 19, wherein the at least one starting address for each of the plurality of rows and the at least one ending address for each of the plurality of rows, correspond to one or more modules of the design that are located in the integrated circuit.

\* \* \* \* \*